US010294395B2

(12) United States Patent
Matsumura et al.

(10) Patent No.: US 10,294,395 B2
(45) Date of Patent: May 21, 2019

(54) ADHESIVE COMPOSITION, SEMICONDUCTOR DEVICE CONTAINING CURED PRODUCT THEREOF, AND METHOD FOR MANUFACTURING SEMICONDUCTOR DEVICE USING SAME

(71) Applicant: TORAY INDUSTRIES, INC., Tokyo (JP)

(72) Inventors: Kazuyuki Matsumura, Otsu (JP); Koichi Fujimaru, Otsu (JP); Daisuke Kanamori, Otsu (JP)

(73) Assignee: TORAY INDUSTRIES, INC., Tokyo (JP)

( * ) Notice: Subject to any disclaimer, the term of this patent is extended or adjusted under 35 U.S.C. 154(b) by 0 days.

(21) Appl. No.: 15/533,182

(22) PCT Filed: Dec. 1, 2015

(86) PCT No.: PCT/JP2015/083758
§ 371 (c)(1),
(2) Date: Jun. 5, 2017

(87) PCT Pub. No.: WO2016/093114
PCT Pub. Date: Jun. 16, 2016

(65) Prior Publication Data

US 2017/0362472 A1 Dec. 21, 2017

(30) Foreign Application Priority Data

Dec. 8, 2014 (JP) ................................ 2014-247633

(51) Int. Cl.
*C09J 11/04* (2006.01)
*C09J 171/12* (2006.01)
(Continued)

(52) U.S. Cl.
CPC ............... *C09J 11/04* (2013.01); *C09J 11/06* (2013.01); *C09J 163/00* (2013.01); *C09J 171/12* (2013.01);
(Continued)

(58) Field of Classification Search
None
See application file for complete search history.

(56) References Cited

U.S. PATENT DOCUMENTS

2011/0223420 A1* 9/2011 Ichiroku ................ C08L 71/00 428/355 EP
2015/0315436 A1 11/2015 Fujimaru et al.
2017/0301597 A1* 10/2017 Hoshiyama ............ H01L 23/29

FOREIGN PATENT DOCUMENTS

JP 2012190924 A 10/2012
JP 2013173834 A 9/2013
(Continued)

OTHER PUBLICATIONS

International Search Report and Written Opinion for International Application No. PCT/JP2015/083758, dated Mar. 8, 2016—6 Pages.

*Primary Examiner* — Asok K Sarkar
(74) *Attorney, Agent, or Firm* — RatnerPrestia

(57) ABSTRACT

The purpose of the present invention is to provide an adhesive composition which allows an alignment mark to be recognized, ensures sufficient solder wettability of a joining section, and is excellent in suppression of void generation. The adhesive composition includes: a high-molecular compound (A); an epoxy compound (B) having a weight average molecular weight of 100 or more and 3,000 or less; and a flux (C); and inorganic particles (D) which have on the surfaces thereof an alkoxysilane having a phenyl group and which have an average particle diameter of 30 to 200 nm, the flux (C) containing an acid-modified rosin.

6 Claims, 1 Drawing Sheet

(51) Int. Cl.

| | |
|---|---|
| ***C09J 11/06*** | (2006.01) |
| ***C09J 163/00*** | (2006.01) |
| ***C09J 201/00*** | (2006.01) |
| ***C09J 193/04*** | (2006.01) |
| ***H01L 23/544*** | (2006.01) |
| ***H01L 23/00*** | (2006.01) |

(52) U.S. Cl.

CPC .......... *C09J 193/04* (2013.01); *C09J 201/00* (2013.01); *H01L 23/544* (2013.01); *H01L 24/16* (2013.01); *H01L 24/81* (2013.01); *H01L 2223/54426* (2013.01); *H01L 2224/16145* (2013.01); *H01L 2224/16227* (2013.01); *H01L 2224/16265* (2013.01); *H01L 2224/16501* (2013.01); *H01L 2224/8113* (2013.01); *H01L 2224/81855* (2013.01); *H01L 2924/3512* (2013.01)

(56) References Cited

FOREIGN PATENT DOCUMENTS

| | | | |
|---|---|---|---|
| JP | 2014107321 | A | 6/2014 |
| JP | 2014140006 | A | 7/2014 |
| WO | 2014103637 | A1 | 7/2014 |

* cited by examiner

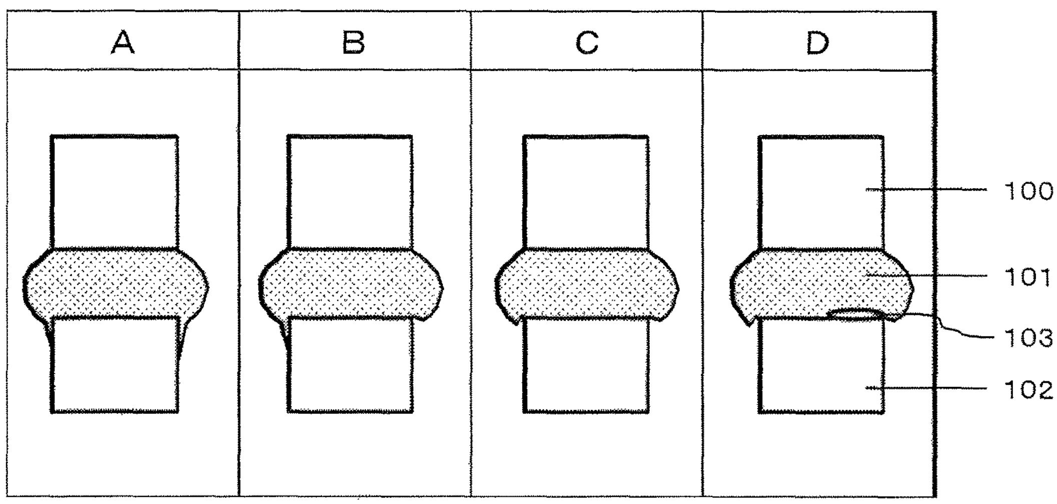
A
B
C
D
100
101
103
102

ADHESIVE COMPOSITION, SEMICONDUCTOR DEVICE CONTAINING CURED PRODUCT THEREOF, AND METHOD FOR MANUFACTURING SEMICONDUCTOR DEVICE USING SAME

CROSS REFERENCE TO RELATED APPLICATIONS

This is the U.S. National Phase application of PCT/JP2015/083758, filed Dec. 1, 2015, which claims priority to Japanese Patent Application No. 2014-247633, filed Dec. 8, 2014, the disclosures of these applications being incorporated herein by reference in their entireties for all purposes.

FIELD OF THE INVENTION

The present invention relates to an adhesive composition to be used in electrically joining or bonding a semiconductor chip to a circuit board, and joining or laminating semiconductor chips together, a semiconductor device containing a cured product thereof, and a method for manufacturing the adhesive composition.

BACKGROUND OF THE INVENTION

In recent years, semiconductor devices have been downsized and densified, and accordingly, flip-chip mounting has been given attention, and rapidly spread as a method of mounting a semiconductor chip on a circuit board. In flip-chip mounting, an epoxy resin-based adhesive is interposed between a bump electrode formed on a semiconductor chip and a pad electrode on a circuit board as a general method for bonding the semiconductor chip.

For flip-chip mounting in which a solder is provided on a bump electrode, an adhesive having a flux function has been proposed for removing an oxide film existing on a solder surface and an electrode surface (see, for example, Patent Documents 1 and 2).

In flip-chip mounting, it is required that an alignment mark formed on a board or a chip be recognized through an adhesive composition. In other words, the adhesive composition is required to have transparency. However, when a semiconductor device is to be prepared using an adhesive composition as described above, an alignment mark may be unrecognizable due to poor transparency, solder wettability of a joining section after mounting may be inadequate due to insufficient flux property, or voids may remain in the semiconductor device after mounting.

PATENT DOCUMENTS

Patent Document 1: Japanese Patent Laid-open Publication No. 2013-173834

Patent Document 2: International Publication No. WO 2014/103637

SUMMARY OF THE INVENTION

In view of such situations, an object of the present invention is to provide an adhesive composition which allows an alignment mark to be recognized, ensures sufficient solder wettability of a joining section, and is excellent in suppression of void generation.

That is, the present invention pertains to an adhesive composition including: a high-molecular compound (A); an epoxy compound (B) having a weight average molecular weight of 100 or more and 3,000 or less; and a flux (C); and inorganic particles (D) which have on the surfaces thereof an alkoxysilane having a phenyl group and which have an average particle diameter of 30 to 200 nm, the flux (C) containing an acid-modified rosin.

According to the present invention, there can be provided an adhesive composition which allows an alignment mark to be recognized, ensures sufficient solder wettability of a joining section, and is excellent in suppression of void generation.

BRIEF DESCRIPTION OF THE DRAWING

FIG. 1 is a schematic view showing solder wettability of a joining section in a semiconductor device prepared using an adhesive composition of the present invention.

DETAILED DESCRIPTION OF EMBODIMENTS OF THE INVENTION

An adhesive composition according to an embodiment of the present invention includes: a high-molecular compound (A); an epoxy compound (B) having a weight average molecular weight of 100 or more and 3,000 or less; and a flux (C); and inorganic particles (D) which have on the surfaces thereof an alkoxysilane having a phenyl group and which have an average particle diameter of 30 to 200 nm, the flux (C) containing an acid-modified rosin.

The adhesive composition of embodiments of the present invention is excellent in film-forming property when formed into a film because the adhesive composition includes the high-molecular compound (A). The high-molecular compound is a compound having a weight average molecular weight of 5,000 or more and 500,000 or less.

Examples of the high-molecular compound (A) include, but are not limited to, acrylic resin, phenoxy resin, polyester resin, polyurethane resin, polyimide resin, siloxane-modified polyimide resin, polybenzoxazole resin, polyamide resin, polycarbonate resin and polybutadiene. These compounds may be used in combination of two or more thereof. Among them, phenoxy resin is preferred because the dispersibility of the inorganic particles (D) which have on the surfaces thereof an alkoxysilane having a phenyl group and which have an average particle diameter of 30 to 200 nm is improved, and thus transparency as a film is enhanced, so that recognition of an alignment mark is facilitated. Polyimide resin is preferred for suppressing voids after mounting.

The lower limit of the weight average molecular weight of the high-molecular compound (A) is preferably 10,000 or more, more preferably 30,000 or more. The upper limit of the weight average molecular weight of the high-molecular compound (A) is preferably 100,000 or less, more preferably 80,000 or less. When the adhesive composition includes two or more compounds as the high-molecular compound (A), at least one of the compounds may be in the above-mentioned range. When the weight average molecular weight is 10,000 or more, the mechanical strength of a cured film is improved, and crack generation etc. in a thermal cycle test is suppressed, so that a semiconductor device having high reliability can be obtained. When the weight average molecular weight is 100,000 or less, the fluidity of the adhesive composition is enhanced, so that solder wettability of a joining section after mounting is improved. The weight average molecular weight of the high-molecular compound (A) in the present invention is measured by a gel permeation chromatography method (GPC method), and calculated in terms of polystyrene.

The adhesive composition of embodiments of the present invention includes the epoxy compound (B) having a weight average molecular weight of 100 or more and 3,000 or less. Since the epoxy compound is generally cured by a ring-opening reaction accompanied by no shrinkage, it becomes possible to reduce the shrinkage of the adhesive composition during curing. When the weight average molecular weight is 100 or more and 3,000 or less, the epoxy compound has high reactivity, and resultantly, the curing rate increases, so that voids after mounting can be suppressed. The epoxy compound (B) having a weight average molecular weight of 100 or more and 3,000 or less is preferably an epoxy compound having two or more epoxy groups, or an epoxy compound having an epoxy equivalent of 100 to 500. By setting the epoxy equivalent to 100 or more, the toughness of the cured adhesive composition can be increased. By setting the epoxy equivalent to 500 or less, the crosslinking density of the cured adhesive composition can be increased to improve heat resistance. The weight average molecular weight of the epoxy compound (B) having a weight average molecular weight of 100 or more and 3,000 or less in the present invention is measured by a gel permeation chromatography method (GPC method), and calculated in terms of polystyrene as in the case of the weight average molecular weight of the high-molecular compound (A).

Preferably, the epoxy compound (B) having a weight average molecular weight of 100 or more and 3,000 or less contains both a liquid epoxy compound and a solid epoxy compound. When the epoxy compound (B) contains a liquid epoxy compound, cracks in a film can be suppressed at the time when the adhesive composition is formed into a film. When the epoxy compound (B) contains a solid epoxy compound, generation of voids after mounting can be suppressed.

Here, the liquid epoxy compound is an epoxy compound exhibiting a viscosity of 150 Pa·s or less at 25° C. at $1.013\times10^5$ N/m$^2$, and the solid epoxy compound is an epoxy compound exhibiting a viscosity of more than 150 Pa·s at 25° C. Examples of the liquid epoxy compound include, but are not limited to, jER (registered trademark) YL980, jER (registered trademark) YL983U, jER (registered trademark) 152, jER (registered trademark) 630 and jER (registered trademark) YX8000 (trade names, manufactured by Mitsubishi Chemical Corporation), and EPICLON (registered trademark) HP-4032 (trade name, manufactured by DIC CORPORATION). These compounds may be used in combination of two or more thereof. Examples of the solid epoxy compound include, but are not limited to, jER (registered trademark) 1002, jER (registered trademark) 1001, jER (registered trademark) YX4000H, jER (registered trademark) 4004P, jER (registered trademark) 5050, jER (registered trademark) 154, jER (registered trademark) 157S70, jER (registered trademark) 180S70 and jER (registered trademark) 1032H60 (trade names, manufactured by Mitsubishi Chemical Corporation), TEPIC (registered trademark) S (trade name, manufactured by NISSAN CHEMICAL INDUSTRIES, LTD.), EPOTOTE (registered trademark) YH-434L (trade name, manufactured by Nippon Steel Chemical Co., Ltd.), EPPN502H, NC3000 (trade name, manufactured by Nippon Kayaku Co., Ltd.), EPICLON (registered trademark) N695, EPICLON (registered trademark) N865, EPICLON (registered trademark) HP-7200 and EPICLON (registered trademark) HP-4700 (trade names, manufactured by DIC CORPORATION). These compounds may be used in combination of two or more thereof.

The content of the epoxy compound (B) having a weight average molecular weight of 100 or more and 3,000 or less is preferably 50 parts by mass or more, more preferably 100 parts by mass or more based on 100 parts by mass of the high-molecular compound (A) for sufficiently exhibiting adhesive strength and improving connection reliability of the semiconductor device after mounting. Meanwhile, the content of the epoxy compound (B) is preferably 500 parts by mass or less, more preferably 300 parts by mass or less for improving solder wettability of a joining section.

The adhesive composition of embodiments of the present invention includes a flux (C), the flux (C) containing an acid-modified rosin. The flux (C) is a compound that removes an oxide on a metal surface to improve solder wettability. The acid-modified rosin is obtained by subjecting a raw material rosin such as gum rosin, wood rosin or tall rosin to a Diels-Alder reaction (addition reaction) with an unsaturated carboxylic acid such as (meth)acrylic acid, (anhydrous) maleic acid, fumaric acid, (anhydrous) citraconic acid or (anhydrous) itaconic acid. As the raw material rosin, a raw material rosin refined for removing impurities such as metal by distillation, recrystallization, extraction or the like and improving the resin color is preferably used. The acid-modified rosin can be hydrogenated to be converted into an acid-modified rosin having a transparent color. Examples of such an acid-modified rosin include PINECRYSTAL (registered trademark) KE-604, PINECRYSTAL (registered trademark) KR-120 and MALKYD (registered trademark) No. 33 (trade names, manufactured by Arakawa Chemical Industries, Ltd). These acid-modified rosins each contain two or more carboxyl groups. Thus, the acid-modified rosin can react with an epoxy compound to form a network structure having a high density, leading to improvement of heat resistance. The acid-modified rosin has a bulky structure specific to the compound itself, and a bulky structure generated by acid modification, and these structures sterically hinder the reaction of epoxy into a carboxyl group, so that the storage life of the adhesive composition at room temperature is improved. Meanwhile, at a temperature near a solder melting point, i.e. 200° C. to 250° C., molecular mobility of the acid-modified rosin increases, so that an oxide film on a solder surface and a joining metal surface is removed to improve solder wettability of a joining section.

The content of the acid-modified rosin in the flux (C) is preferably 50 mass % or more, more preferably 90 mass % or more, still more preferably 95 mass % or more for improving the storage stability of the adhesive composition at room temperature and suppressing voids after mounting. The upper limit of the content of the acid-modified rosin is 100 mass % where the whole of the flux is constituted by the acid-modified rosin.

For improving solder wettability, the content of the acid-modified rosin in the flux (C) in the adhesive composition is preferably 5 parts by mass or more, more preferably 10 parts by mass or more, still more preferably 15 parts by mass or more based on 100 parts by mass of the inorganic particles (D) which have on the surfaces thereof an alkoxysilane having a phenyl group and which have an average particle diameter of 30 to 200 nm. Meanwhile, for suppressing voids after mounting, the content of the flux (C) is preferably 35 parts by mass or less, more preferably 30 parts by mass or less, still more preferably 25 parts by mass or less based on 100 parts by mass of the inorganic particles (D) which have on the surfaces thereof an alkoxysilane having a phenyl group and which have an average particle diameter of 30 to 200 nm.

The adhesive composition of embodiments of the present invention includes the inorganic particles (D) which have on the surfaces thereof an alkoxysilane having a phenyl group and which have an average particle diameter of 30 to 200 nm. When inorganic particles (D) which have on the surfaces thereof an alkoxysilane having a phenyl group have an average particle diameter of 30 to 200 nm as described above, the dispersibility of the inorganic particles in the adhesive resin composition is improved, and resultantly, the transparency of the adhesive composition is secured, so that an alignment mark can be recognized. Since the dispersibility of the inorganic particles is improved, the adhesive composition can be filled with the inorganic particles in a high concentration, so that generation of voids in the adhesive composition after mounting can be suppressed, and the linear expansion coefficient when the adhesive composition is formed into a cured product can be reduced to improve connection reliability of the semiconductor device. The lower limit of the average particle diameter of the inorganic particles (D) which have on the surfaces thereof an alkoxysilane having a phenyl group and which have an average particle diameter of 30 to 200 nm is preferably 50 nm or more, more preferably 75 nm or more. The upper limit of the average particle diameter of the inorganic particles (D) which have on the surfaces thereof an alkoxysilane having a phenyl group and which have an average particle diameter of 30 to 200 nm is preferably 175 nm or less, more preferably 150 nm or less.

Examples of the inorganic particles which have on the surfaces thereof an alkoxysilane having a phenyl group and which have an average particle diameter of 30 to 200 nm may include inorganic particles surface-treated with a phenylsilane coupling agent, for example phenylsilane-treated Sciqas 0.15 μm, phenylsilane-treated Sciqas 0.1 μm and phenylsilane-treated Sciqas 0.05 μm (trade names, manufactured by Sakai Chemical Industry Co., Ltd.), and YA050C (trade name, manufactured by Admatechs Co., Ltd.).

The average particle diameter of the inorganic particles refers to a particle diameter in the case where the inorganic particles are present singly and refers to an average of observed particle diameters. When the inorganic particles have a spherical shape, the particle diameter refers to its diameter, and when the inorganic particles have an elliptical shape or a flattened shape, the particle diameter refers to the maximum length in its shape. Moreover, when the shape is a rod shape or a fibrous shape, the particle diameter represents the maximum length in the longitudinal direction. As a method of measuring an average particle diameter of the inorganic particles in the adhesive composition, the average particle diameter can be measured by a method in which the particles are directly observed with a SEM (scanning electron microscope) and an average of the particle diameters of 100 particles is calculated.

Examples of the material to be used for the inorganic particles (D) which have on the surfaces thereof an alkoxysilane having a phenyl group and which have an average particle diameter of 30 to 200 nm include silicates such as talc, fired clay, non-fired clay, mica and glass; oxides such as titanium oxide, alumina and silica; carbonates such as calcium carbonate and magnesium carbonate; hydroxides such as aluminum hydroxide, magnesium hydroxide and calcium hydroxide; sulfates or sulfites such as barium sulfate, calcium sulfate and calcium sulfite; borates such as zinc borate, barium metaborate, aluminum borate, calcium borate and sodium borate; and nitrides such as aluminum nitride, boron nitride and silicon nitride. The adhesive composition may include a plurality of kinds of these inorganic particles, but silica or titanium oxide is preferred from the viewpoint of reliability and cost.

The content of the inorganic particles (D) which have on the surfaces thereof an alkoxysilane having a phenyl group and which have an average particle diameter of 30 to 200 nm is preferably 45 parts by mass or more, more preferably 50 parts by mass or more based on the total amount of organic substances in the adhesive composition excluding the solvent. When the content of the inorganic particles (D) is 45 parts by mass or more, generation of voids in the adhesive composition after mounting can be suppressed, and the linear expansion coefficient when the adhesive composition is formed into a cured product can be reduced to improve connection reliability of the semiconductor device. The content of the inorganic particles (D) is preferably 70 mass % or less, more preferably 65 parts by mass or less for suppressing aggregation of inorganic particles, improving the fluidity of the adhesive composition and improving solder wettability of a joining section after mounting.

The inorganic particles (D) which have on the surfaces thereof an alkoxysilane having a phenyl group and which have an average particle diameter of 30 to 200 nm may have either a spherical shape or a nonspherical shape such as an elliptic shape, a flat shape, a rod shape or a fiber shape, but spherical inorganic particles can be preferably used because they are easily uniformly dispersed in an alkali-soluble adhesive film.

Preferably, the adhesive composition of the present invention includes a curing accelerator (E). When the curing accelerator exists in the adhesive composition without being dissolved therein, the curing reaction of an epoxy compound is slowed, so that storage property at room temperature is improved, and therefore it is preferred to use curing accelerator particles as the curing accelerator (E). Use of imidazole-based curing accelerator particles as the curing accelerator particles is preferred because the curing rate of epoxy resin can be increased to suppress voids after mounting. As such curing accelerator particles, CUREZOL (registered trademark) 2PZCNS, CUREZOL (registered trademark) 2PZCNS-PW, CUREZOL (registered trademark) C11Z-CNS, CUREZOL (registered trademark) 2MZ-A, CUREZOL (registered trademark) C11-A, CUREZOL (registered trademark) 2E4MZ-A, CUREZOL (registered trademark) 2MZA-PW, CUREZOL (registered trademark) 2MAOK-PW, CUREZOL (registered trademark) 2PHZ-PW (trade names, manufactured by SHIKOKU CHEMICALS CORPORATION).

The lower limit of the average particle diameter of the curing accelerator particles is preferably 0.1 μm or more, more preferably 0.15 μm or more. The upper limit of the average particle diameter of the curing accelerator particles is preferably 2 μm or less, more preferably 1 μm or less. Here, the average particle diameter refers to an average particle diameter in the case where the curing accelerator particles are present singly. When the curing accelerator particles have a spherical shape, the particle diameter refers to its diameter, and when the curing accelerator have an elliptical shape or a flattened shape, the particle diameter refers to the maximum length in its shape. Moreover, when the shape is a rod shape or a fibrous shape, the particle diameter represents the maximum length in the longitudinal direction. As a method for measuring the average particle diameter, the average particle diameter can be measured by a method in which the particles are directly observed with a SEM (scanning electron microscope) and an average of the particle diameters of 100 particles is calculated. When the average particle diameter is 0.1 μm or more, the dispersibility in the adhesive film is improved, and thus transparency as a film is enhanced, so that recognition of an alignment mark is facilitated. When the average particle diameter is 2 μm or less, the specific surface area of the curing accelerator increases, so that the curing reaction of the epoxy compound easily proceeds, and the amount of the curing accelerator contained in the adhesive composition decreases, so that generation of voids after mounting can be suppressed.

For causing the curing reaction of the epoxy compound to proceed, sufficiently exhibiting adhesive strength and improving connection reliability of the semiconductor device after mounting, the content of the curing accelerator (E) is preferably 1 part by mass or more, more preferably 3 parts by mass or more based on 100 parts by mass of the epoxy compound (B) having a weight average molecular weight of 100 or more and 3,000 or less. For suppressing the curing reaction, improving storage stability, and resultantly improving solder wettability of a joining section, the content of the curing accelerator (E) is preferably 15 parts by mass or less, more preferably 10 parts by mass or less based on 100 parts by mass of the epoxy compound (B) having a weight average molecular weight of 100 or more and 3,000 or less.

The adhesive composition of the present invention may further include an ion capturing agent, a surfactant, a silane coupling agent, an organic dye, an inorganic pigment and so on.

In the adhesive composition of the present invention, the constituent materials may be used as a varnish in the solvent, and the varnish may be applied on a releasable substrate, and desolventized to be formed into a film.

As the solvent, ketone-based solvents such as acetone, methyl ethyl ketone, methyl isobutyl ketone, cyclopentanone and cyclohexanone; ether-based solvents such as 1,4-dioxane, tetrahydrofuran and diglyme; glycol ether-based solvents such as methyl cellosolve, ethyl cellosolve, propylene glycol monomethyl ether, propylene glycol monoethyl ether, propylene glycol monobutyl ether and diethylene glycol methyl ethyl ether; and other solvents such as benzyl alcohol, N-methylpyrrolidone, γ-butyrolactone, ethyl acetate and N,N-dimethylformamide can be used singly, or used in mixture of two or more thereof, but the solvent is not limited thereto.

Examples of the releasable substrate include, but are not limited to, polypropylene films, polyethylene terephthalate films, polyethylene naphthalate films, polyester films, polyvinyl chloride films, polycarbonate films, polyimide films, fluororesin films such as polytetrafluoroethylene films, polyphenylene sulfide films, polypropylene films and polyethylene films. The releasable substrate may be subjected to a release treatment with a silicone-based release agent, a long-chain alkyl-based release agent, a fluorine-based release agent, an aliphatic amide-based release agent or the like. The thickness of the releasable substrate is not particularly limited, but normally, it is preferably 5 to 75 μm. Preferably, another releasable substrate is further laminated to a surface of the adhesive on a side opposite to a surface having the releasable substrate, thereby forming an adhesive film that is vertically sandwiched between releasable substrates. The material and thickness of the other releasable substrate may be the same as the material and thickness of the foregoing releasable substrate. Both the releasable substrates may be the same.

The adhesive composition prepared in the form of a varnish by mixing the constituent materials in the solvent can be applied to a semiconductor wafer or a circuit board, and desolventized.

The adhesive composition of the present invention can be suitably used as a semiconductor adhesive composition for bonding or fixing circuit members such as a semiconductor element, a circuit board and a metal wiring material to be used in a semiconductor device, or sealing the semiconductor element.

A semiconductor device of embodiments of the present invention includes a cured product of the adhesive composition or a cured product of the adhesive composition film. The semiconductor device referred to herein refers to overall devices capable of functioning by use of characteristics of a semiconductor element. Semiconductor devices include all of semiconductor elements connected to boards, semiconductor elements connected together, boards connected together, electrooptic devices, semiconductor circuit boards and electronic devices.

A method for manufacturing a semiconductor device according to embodiments of the present invention includes interposing the adhesive composition or the adhesive composition film between a first circuit member and a second circuit member, and applying heat and pressure to electrically connect the first circuit member and the second circuit member.

One example of the method for manufacturing a semiconductor device using the adhesive composition of the present invention is as follows. First, a first circuit member having a first connection terminal and a second circuit member having a second connection terminal are provided. Here, examples of the circuit members include chip components such as semiconductor chips, resistor chips and capacitor chips; semiconductor chips or silicon interposers having TSV (through-silicon via) electrodes; and boards such as glass epoxy circuit boards and film circuit boards. Examples of the connection terminal include bump electrodes such as plated bumps and stud bumps, and pad electrodes. Further, a through electrode may be formed in one or both of the first circuit member and/or the second circuit member, and a connection terminal may be formed on one surface and/or both surfaces of the member.

The first circuit member and the second circuit member are arranged in such a manner that the first connection terminal and the second connection terminal are opposed to each other. Next, the adhesive composition of the present invention is interposed between the first connection terminal and the second connection terminal arranged so as to be opposed to each other. The first connection terminal and the second connection terminal arranged so as to be opposed to each other are electrically connected by applying heat and pressure to the first circuit member and the second circuit member. Through this process, the first circuit member and the second circuit member are electrically connected firmly, and also the adhesive is cured to physically fix the first circuit member and the second circuit member.

Here, the adhesive composition may be added to the surface on the connection terminal side of only one of the circuit members, or may be formed on the surfaces on the connection terminal side of both of the first circuit member and the second circuit member.

As an example of a more detailed embodiment, a method will be described in which a semiconductor chip having a bump is provided as a first circuit member, a circuit board or semiconductor chip having a wiring pattern is provided as a second circuit member, both the circuit members are connected while the adhesive composition of the present invention is interposed therebetween, and an air gap between the first circuit member and the second circuit member is sealed with an adhesive to prepare a semiconductor device.

First, the adhesive composition film is bonded to the second circuit member which is the circuit board or semiconductor chip provided with a wiring pattern. Here, the adhesive composition film may be cut to a predetermined size, and then bonded to a wiring pattern surface of the circuit board provided with a wiring pattern, or a bump-formed surface of the semiconductor chip. Alternatively, the adhesive film may be bonded to a bump-formed surface of a semiconductor wafer, followed by dicing and individualizing the semiconductor wafer to prepare a semiconductor chip with the adhesive film bonded thereto.

Next, the semiconductor chip that is the first circuit member is arranged in such a manner that the bump of the first circuit member and the wiring pattern of the second circuit member are opposed to each other, and heat and pressure are applied to both the members using a bonding apparatus. Conditions for application of heat and pressure are not particularly limited as long as good electrical connection can be achieved, but it is necessary to apply heat and pressure at a temperature of 100° C. or higher and a pressure of 1 mN/bump or more for 0.1 second or more in order to cure the adhesive. Bonding is performed under conditions of a temperature of preferably 120° C. or higher and 300° C. or lower, more preferably 150° C. or higher and 250° C. or lower, a pressure of preferably 5 mN/bump or more and 50000 mN/bump or less, more preferably 10 mN/bump or more and 10000 mN/bump or less, and a time of preferably 1 second or more and 60 seconds or less, more preferably 2 seconds or more and 30 seconds or less. Further, in the bonding, the bump on the semiconductor chip may be brought into contact with the wiring pattern on the circuit board by application of heat and pressure at a temperature of 50° C. or higher and a pressure of 1 mN/bump or more for 0.1 second or more as temporary press-bonding, followed by performing bonding under the above-mentioned conditions. After the bonding, as required, the circuit board provided with the semiconductor chip may be heated at a temperature of 50° C. or higher and 200° C. or lower for 10 seconds or more and 24 hours or less.

The adhesive of the present invention can be used as an adhesive resin material for preparing, in addition to this, a die attach film, a dicing die attach film, a lead frame fixing tape, a heat dissipation plate, a reinforcing plate, an adhesive of a shielding material, a solder resist and the like.

EXAMPLES

The present invention will be described in detail below with reference to examples, but these examples are not intended to limit the present invention.

<Weight Average Molecular Weighs of High-Molecular Compound and Epoxy Compound>

Each of the high-molecular compound and the epoxy compound was dissolved in N-methyl-2-pyrrolidone (hereinafter, referred to as NMP) to prepare a solution with a concentration of 0.1 wt %. The solution was used as a measurement sample. A weight average molecular weight on the polystyrene equivalent basis was calculated using a GPC apparatus Waters 2690 (manufactured by Waters Corporation), the configuration of which is as shown below. GPC measurement is performed by using NMP containing 0.05 mol/L of LiCl and 0.05 mol/L of phosphoric acid dissolved therein as a mobile layer at a flow rate of 0.4 mL/min. The column was heated to 40° C. using a column oven.

Detector: Waters 996
System controller: Waters 2690
Columns: TOSOH TSK-GEL α-4000
Columns: TOSOH TSK-GEL α-2500

<Average Particle Diameter of Inorganic Particles>

The particle diameters of 100 particles were observed using a SEM (scanning electron microscope; JSM-6510A manufactured by JEOL Ltd.), and an average thereof was defined as an average particle diameter. In the observation, the diameter of a particle was defined as a particle diameter in the case where the particle was observed as having a circular shape, and the length of a section with the longest distance in the contour of a particle was defined as a particle diameter in the case where the particle was observed as having an elliptic shape or the like.

<Alignment Mark Recognition>

Alignment mark recognition through the adhesive composition was evaluated in the following manner. A protective film was separated from an adhesive film prepared in each of examples and comparative examples, and then the adhesive composition film was laminated to a copper pillar bump-formed surface of a TEG chip with a copper pillar bump (manufactured by WALTS CO., LTD., WALTS-TEG CC80-0101JY) using a laminator (manufactured by MEIKI CO., LTD., MVLP600). The substrate film was separated to prepare an evaluation chip with an adhesive composition. Ten such evaluation chips were prepared. Thereafter, recognizability of a pattern on a chip was evaluated using a camera in a flip-chip bonding apparatus (manufactured by Toray Engineering Co., Ltd., FC-3000WS). The number of evaluation chips in which automatic recognition was possible, among the ten prepared evaluation chips, was recorded.

<Void Evaluation>

After alignment mark recognition was evaluated as described above, a board (manufactured by WALTS CO., LTD., WALTS-KIT CC80-0102JY[MAP]_ModelI (Cu+OSP specification)) serving as an adherend was subjected to flip-chip bonding. In regard to the conditions of flip-chip bonding, a substrate was placed on a bonding stage heated to 140° C., and a chip was temporarily press-bonded under conditions of a temperature of 140° C., a pressure of 150 N/chip and a time of 1 second and then main press-bonded under conditions of a temperature of 250° C., a pressure of 150 N and a time of 5 seconds. Voids in the resulting semiconductor device were observed using an scanning acoustic tomograph (manufactured by Hitachi Power Solutions Co., Ltd., FS300III). In the void evaluation, a ratio of voids to a chip area was recorded. The lower limit of the results was set to 1% or less, and the upper limit of the results was set to 10% or more.

<Evaluation of Bump Wettability of Joining Section>

After void evaluation was performed as described above, a cross-section of the semiconductor device was polished to expose a joining part. Thereafter, a joining shape was observed with an optical microscope. As in FIG. 1, a sample was rated A where both side surfaces of a copper wiring 102 of a board were wetted with a solder 101 of a copper pillar bump 100, a sample was rated B where only one of the side surfaces was wetted, a sample was rated C where either of the side surfaces was not wetted, but the top of the wiring was wetted, and a sample was rated D where either of the side surfaces was not wetted, and an adhesive composition 103 was caught at the top of the wiring (FIG. 1).

A polyimide as a component (A) used in each of examples and comparative examples was synthesized in the following manner.

Synthesis Example 1 Synthesis of Polyimide Under a stream of dry nitrogen, 4.82 g (0.0165 mol) of 1,3-bis(3-aminophenoxy) benzene, 3.08 g (0.011 mol) of 3,3'-diamino-4,4'-dihydroxydiphenyl sulfone, 4.97 g (0.02 mol) of 1,3-bis(3-aminopropyl)tetramethyldisiloxane, and 0.47 g (0.005 mol) of aniline as an terminal blocking agent were dissolved in 130 g of NMP. To the resulting solution, 26.02 g (0.05 mol) of 2,2-bis{4-(3,4-dicarboxyphenoxy) phenyl}propane dianhydride was added together with 20 g of NMP and reacted at 25° C. for 1 hour, and then the solution was stirred at 50° C. for 4 hours. Thereafter, the solution was stirred at 180° C. for 5 hours. After completion of the stirring, the solution was introduced into 3 L of water and filtered to collect a precipitate, and the precipitate was washed with water three times and dried at 80° C. for 20 hours using a vacuum drier. The resulting polymer solid was subjected to infrared absorption spectrum measurement, and consequently absorption peaks of an imide structure attributed to polyimide were detected around 1780 $cm^{-1}$ and around 1377 $cm^{-1}$. The weight average molecular weight of the resulting polyimide was 18000.

In addition, components (A) to (F) used in each of examples and comparative examples are as described below.

Component (A)

1256 (trade name; phenoxy resin; weight average molecular weight: 50000; manufactured by Mitsubishi Chemical Corporation)

4250 (trade name; phenoxy resin; weight average molecular weight: 60000; manufactured by Mitsubishi Chemical Corporation)

Component (B)

YL-980 (trade name; liquid epoxy compound; weight average molecular weight: 370; manufactured by Mitsubishi Chemical Corporation)

N-865 (trade name; solid epoxy compound; weight average molecular weight: 850; manufactured by DIC Corporation)

1032H60 (trade name; solid epoxy compound; weight average molecular weight: 525; manufactured by Mitsubishi Chemical Corporation)

Component (C)

KR-120 (trade name; acid-modified rosin 100%, manufactured by Arakawa Chemical Industries, Ltd.)

Component (D)

phenylsilane-treated Sciqas 0.15 μm (trade name; silica; average particle diameter: 150 nm; subjected to a phenylsilane coupling surface treatment, i.e. having on the surface an alkoxysilane having a phenyl group; manufactured by Sakai Chemical Industry Co., Ltd.)

YA050C (trade name; silica; average particle diameter: 50 nm; subjected to a phenylsilane coupling surface treatment, i.e. having on the surface an alkoxysilane having a phenyl group; manufactured by Admatechs Co., Ltd.)

Component (E)

2MAOK-PW (trade name; imidazole-based curing accelerator particles; manufactured by SHIKOKU CHEMICALS CORPORATION)

Other Component (F)

adipic acid (flux)

Sciqas 0.15 μm (trade name; silica; average particle diameter: 150 nm; surface-untreated; manufactured by Sakai Chemical Industry Co., Ltd.)

Examples 1 to 9 and Comparative Examples 1 to 3

(1) Method for Preparation of Adhesive Composition Film

Components (A) to (F) as shown in Table 1 were mixed in composition ratios as described in Table 1, thereby preparing an adhesive composition varnish. Cyclohexanone was used as an organic solvent, and additives other than the solvent were used in the form of a solid to obtain an adhesive composition varnish with a solid concentration of 53%. The prepared adhesive composition varnish was applied to a surface to be treated of a 38 μm-thick polyethylene terephthalate film as a releasable substrate using a slit die coater (coating machine), and dried at 100° C. for 10 minutes. A pressure sensitive adhesive surface of a dicing tape (T1902-90, polyolefin substrate, manufactured by Furukawa Electric Co., Ltd.) was laminated onto the dried 30 μm-thick adhesive film obtained as described above, thereby preparing an adhesive composition film sandwiched between a substrate film and a protective film. Here, the dicing tape serves as the substrate film, and the polyethylene terephthalate film serves as the protective film. Using the resulting adhesive composition film, alignment mark recognition, void evaluation, and evaluation of solder wettability of a joining section were performed. Results are shown in Table 1.

TABLE 1

| | | | Example 1 | Example 2 | Example 3 | Example 4 | Example 5 | Example 6 | Example 7 |
|---|---|---|---|---|---|---|---|---|---|
| Adhesive composition (parts by mass) | Component (A) | Phenoxy resin 1256 (MW: 50,000) | — | 27 | 27 | 27 | 22 | — | 19 |
| | | Phenoxy resin 4250 (MW: 60,000) | 35 | — | — | — | — | 30 | — |
| | | Polyimide of Synthetic Example 1 (MW: 18,000) | — | — | — | — | — | — | 8 |
| | Component (B) | YL-980 (MW: 370) | 8 | 30 | 30 | 30 | 30 | 8 | 30 |
| | | N-865 (MW: 850) | 30 | — | — | — | — | 30 | — |
| | | 1032H60 (MW: 525) | — | 22 | 22 | 22 | 15 | — | 22 |
| | Component (C) | Acid-modified rosin KR-120 | 25 | 18 | 18 | 18 | 30 | 30 | 18 |
| | Component (D) | Sciqas 0.15 μm Phenylsilane treatment | 100 | 100 | 150 | 185 | 150 | 100 | 100 |
| | | YA050C (phenylsilane treatment) | — | — | — | — | — | — | — |

TABLE 1-continued

| | | | | | | | | |
|---|---|---|---|---|---|---|---|---|
| Component (E) | Imidazole-based curing accelerator 2MAOK-PW | 2 | 3 | 3 | 3 | 3 | 2 | 3 |
| Component (F) | Adipic acid | — | — | — | — | — | — | — |
| | Sciqas 0.15 μm | — | — | — | — | — | — | — |
| Content of component (C) (parts by mass) based on 100 parts by mass of component (D) | | 25 | 18 | 12 | 9.7 | 20 | 30 | 18 |
| Content of component (D) (mass %) based on the total amount of adhesive composition | | 50 | 50 | 60 | 65 | 60 | 50 | 50 |
| Alignment mark recognition | | 10 | 10 | 9 | 8 | 10 | 10 | 10 |
| Voids | | 5% | 4% | 1% or less | 1% or less | 3% | 7% | 1% or less |
| Solder wettability of joining section | | A | A | B | C | A | A | A |

| | | | Example 8 | Example 9 | Comparative Example 1 | Comparative Example 2 | Comparative Example 3 |
|---|---|---|---|---|---|---|---|
| Adhesive composition (parts by mass) | Component (A) | Phenoxy resin 1256 (MW: 50,000) | 20 | — | 35 | 27 | 27 |
| | | Phenoxy resin 4250 (MW: 60,000) | — | — | — | — | — |
| | | Polyimide of Synthetic Example 1 (MW: 18,000) | — | 27 | — | — | — |
| | Component (B) | YL-980 (MW: 370) | 30 | 30 | 30 | 30 | 30 |
| | | N-865 (MW: 850) | — | — | — | — | — |
| | | 1032H60 (MW: 525) | 22 | 22 | 32 | 22 | 22 |
| | Component (C) | Acid-modified rosin KR-120 | 25 | 18 | — | — | 18 |
| | Component (D) | Sciqas 0.15 μm Phenylsilane treatment | — | 100 | 100 | 100 | — |
| | | YA050C (phenylsilane treatment) | 150 | — | — | — | — |
| | Component (E) | Imidazole-based curing accelerator 2MAOK-PW | 3 | 3 | 3 | 3 | 3 |
| | Component (F) | Adipic acid | — | — | — | 18 | — |
| | | Sciqas 0.15 μm | — | — | — | — | 100 |
| Content of component (C) (parts by mass) based on 100 parts by mass of component (D) | | | 17 | 18 | 0 | 0 | 18 |
| Content of component (D) (mass %) based on the total amount of adhesive composition | | | 60 | 50 | 50 | 50 | 0 |
| Alignment mark recognition | | | 10 | 8 | 10 | 10 | 6 |
| Voids | | | 1% or less | 1% or less | 1% or less | 10% or more | 10% or more |
| Solder wettability of joining section | | | B | A | D | C | A |

An adhesive composition of the present invention can be used as an adhesive to be used for bonding an electronic component or a heat dissipation plate, which is used in a personal computer or a portable terminal, to a printed board or a flexible board, or for bonding boards to each other. Further, the adhesive composition of the present invention can be suitably used as a semiconductor adhesive to be used for bonding or directly electrically joining a semiconductor chip such as IC or LSI to a circuit board such as a flexible board, a glass epoxy board, a glass board or a ceramic board.

DESCRIPTION OF REFERENCE SIGNS

100: Copper pillar bump
101: Solder
102: Copper wiring
103: Adhesive composition

The invention claimed is:

1. An adhesive composition comprising: a high-molecular compound (A) which is a combination of a phenoxy resin and a polyimide resin having a weight average molecular weight of 10,000 or more and 100,000 or less; an epoxy compound (B) having a weight average molecular weight of 100 or more and 3,000 or less; a flux (C) containing an acid-modified rosin; inorganic particles (D) which have on the surfaces thereof an alkoxysilane having a phenyl group and which have an average particle diameter of 30 to 200 nm; and particles of a curing accelerator (E) having an average particle diameter of 0.1 μm or more, wherein the adhesive composition has an alignment mark recognition value which is 7 or more.

2. The adhesive composition according to claim 1, wherein the content of the acid-modified rosin in the flux (C) is 50 wt % or more and 100 wt % or less.

3. The adhesive composition according to claim 1, wherein the content of the acid-modified rosin in the flux (C) is 5 to 35 parts by mass based on 100 parts by mass of the inorganic particles (D) which have on the surfaces thereof an alkoxysilane having a phenyl group and which have an average particle diameter of 30 to 200 nm.

4. The adhesive composition according to claim 1, wherein the content of the inorganic particles (D) which have on the surfaces thereof an alkoxysilane having a phenyl group and which have an average particle diameter of 30 to 200 nm is 45 to 70 mass % based on the total amount of the adhesive composition.

5. A semiconductor device comprising a cured product of the adhesive composition according to claim 1.

6. A method for manufacturing a semiconductor device, the method comprising interposing the adhesive composition according to claim 1 between a first circuit member and a second circuit member, and electrically connecting the first circuit member and the second circuit member.

* * * * *